US012545530B2

(12) United States Patent
Chang et al.

(10) Patent No.: US 12,545,530 B2
(45) Date of Patent: Feb. 10, 2026

(54) FACTORY TRANSITION SYSTEM AND TRANSITION DEVICE THEREOF

(71) Applicant: MIRLE AUTOMATION CORPORATION, Hsinchu (TW)

(72) Inventors: Chih-Wu Chang, Hsinchu (TW); Yu-Jie Chiu, Hsinchu (TW); Chiang-Ni Lu, Hsinchu (TW)

(73) Assignee: MIRLE AUTOMATION CORPORATION, Hsinchu (TW)

(*) Notice: Subject to any disclaimer, the term of this patent is extended or adjusted under 35 U.S.C. 154(b) by 481 days.

(21) Appl. No.: 18/121,699

(22) Filed: Mar. 15, 2023

(65) Prior Publication Data

US 2023/0294933 A1 Sep. 21, 2023

Related U.S. Application Data

(60) Provisional application No. 63/321,087, filed on Mar. 17, 2022.

(30) Foreign Application Priority Data

Aug. 8, 2022 (TW) .................................. 111129661

(51) Int. Cl.
*B65G 49/06* (2006.01)
*F24F 3/167* (2021.01)
(52) U.S. Cl.
CPC ............ *B65G 49/067* (2013.01); *F24F 3/167* (2021.01); *B65G 2201/0297* (2013.01); *B65G 2249/02* (2013.01)

(58) Field of Classification Search
CPC ......... H01L 21/67733; H01L 21/67017; H01L 21/6776; H01L 21/67389; H01L 21/67196;
(Continued)

(56) References Cited

U.S. PATENT DOCUMENTS 5,713,791 A * 2/1998 Long ................. H01L 21/67389
55/385.2
2006/0045669 A1 3/2006 Namioka et al.
(Continued)

FOREIGN PATENT DOCUMENTS

CN 207794708 U 8/2018
CN 111305612 A 6/2020
(Continued)

*Primary Examiner* — Glenn F Myers
(74) *Attorney, Agent, or Firm* — Li & Cai Intellectual Property (USA) Office

(57) ABSTRACT

A factory transition system and a transition device thereof are provided. The transition device is provided for being disposed on a partition wall that separates two rooms from each other, and includes a chamber and a filtering module assembled to the chamber. The chamber has a transition channel formed therein. The transition channel has two entrances respectively arranged on two ends thereof. The chamber is configured to correspond in position to the communication opening of the partition through one of the two entrances. The filtering module is spatially communicated with the transition channel. The filtering module is configured to perform a ventilation and filtration process for continuously suctioning air from an external environment of the transition device into the transition channel after filtering the air.

10 Claims, 11 Drawing Sheets

(58) Field of Classification Search
CPC ............... H01L 21/67184; F24F 3/167; F24F 2003/008; B65G 49/067; B65G 49/07; B65G 2249/02; B65G 2201/0297
See application file for complete search history.

(56) References Cited

U.S. PATENT DOCUMENTS

| | | | |
|---|---|---|---|
| 2008/0003091 A1* | 1/2008 | Bonora | ............. H01L 21/67017 |
| | | | 414/749.6 |
| 2012/0077429 A1 | 3/2012 | Wernimont et al. | |
| 2022/0285192 A1* | 9/2022 | Hsu | ................... H01L 21/67766 |
| 2023/0029508 A1* | 2/2023 | Tsai | ................... H01L 21/67196 |

FOREIGN PATENT DOCUMENTS

| | | | |
|---|---|---|---|
| CN | 210713993 U | | 6/2020 |
| CN | 211851093 U | | 11/2020 |
| JP | 2003007799 A | * | 1/2003 |
| TW | 200602599 A | | 1/2006 |

\* cited by examiner

FACTORY TRANSITION SYSTEM AND TRANSITION DEVICE THEREOF

CROSS-REFERENCE TO RELATED PATENT APPLICATION

This application claims the benefit of priority to Taiwan Patent Application No. 111129661, filed on Aug. 8, 2022. The entire content of the above identified application is incorporated herein by reference.

This application claims the benefit of priority to the U.S. Provisional Patent Application Ser. No. 63/321,087 filed on Mar. 17, 2022, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a transition device, and more particularly to a factory transition system and a transition device thereof for increasing cross-area efficiency.

BACKGROUND OF THE DISCLOSURE

Nowadays, most of the transition devices disposed in a factory are equipped with automatic doors to effectively divide the factory into two areas. However, because the automatic doors are equipped, the cost of the conventional transition devices become higher, and because a waiting time for the automatic doors opening and closing is necessary when objects are transported between the two areas, the manufacturing capacity of the factory is difficult to be further increased.

SUMMARY OF THE DISCLOSURE

In response to the above-referenced technical inadequacies, the present disclosure provides a factory transition system and a transition device thereof to effectively improve the issues associated with conventional transition devices.

In order to solve the above-mentioned problems, one of the technical aspects adopted by the present disclosure provides a factory transition system, which includes a first room, a second room, a partition wall, a track module, and a transition device. The first room and the second room are arranged adjacent to each other, and a first cleanliness requirement of the first room is lower than a second cleanliness requirement of the second room. The partition wall is arranged to separate the first room and the second room from each other. The partition wall has a communication opening for enabling the first room and the second room to be in spatial communication with each other. The track module is arranged in the first room and the second room by passing through the communication opening. The track module is configured to allow at least one transfer vehicle to move thereon. The transition device is arranged in the first room and corresponds in position to the communication opening. The transition device includes a chamber and a filtering module. The chamber has a transition channel formed therein. The transition channel has two entrances respectively arranged on two ends thereof. The chamber corresponds in position to the communication opening through one of the two entrances, and the track module passes through the transition channel. The filtering module is assembled to the chamber and is spatially communicated with the transition channel. The filtering module is configured to perform a ventilation and filtration process for continuously suctioning air from the first room into the transition channel after filtering the air.

In order to solve the above-mentioned problems, the other one of the technical aspects adopted by the present disclosure provides a transition device of a factory transition system for being disposed on a partition wall that separates two rooms from each other. The transition device includes a chamber and a filtering module. The chamber has a transition channel formed therein. The transition channel has two entrances respectively arranged on two ends thereof. The chamber is configured to correspond in position to the communication opening of the partition wall through one of the two entrances. The filtering module is assembled to the chamber and is spatially communicated with the transition channel. The filtering module is configured to perform a ventilation and filtration process for continuously suctioning air from an external environment of the transition device into the transition channel after filtering the air.

Therefore, the factory transition system in the present disclosure is provided with the transition device in the first room, so that the automatic door adopted by the conventional transition device can be effectively replaced by using the filtering module to perform the ventilation and filtration process, thereby preventing air from traveling from the first room to the second room by flowing through the transition channel. Accordingly, the track module and the at least one transfer vehicle can have a better efficiency for transporting objects between the first room and the second room, thereby increasing the manufacturing capacity of factory.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
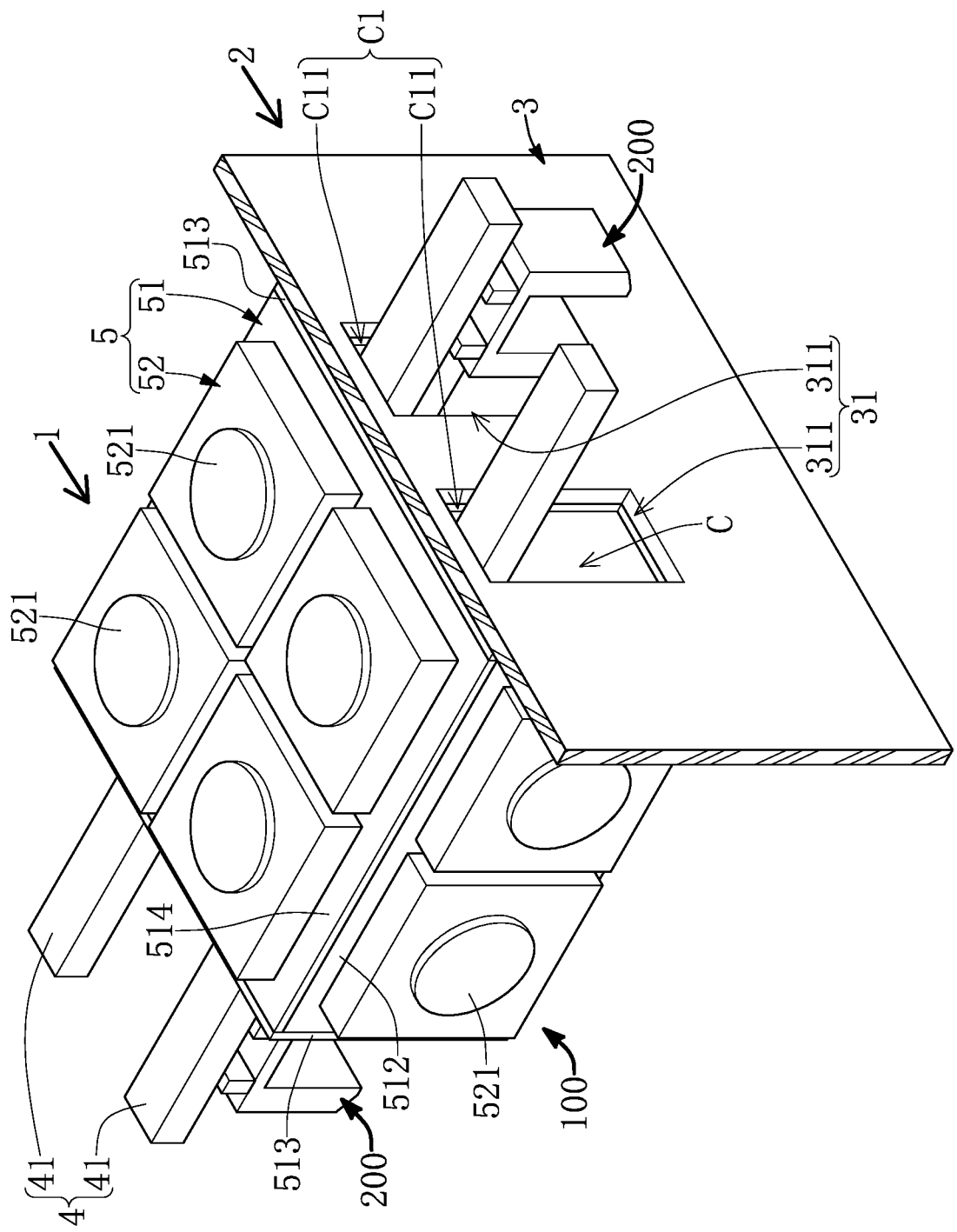
FIG. 1 is a schematic perspective view of a factory transition system according to a first embodiment of the present disclosure.
Figure 2:
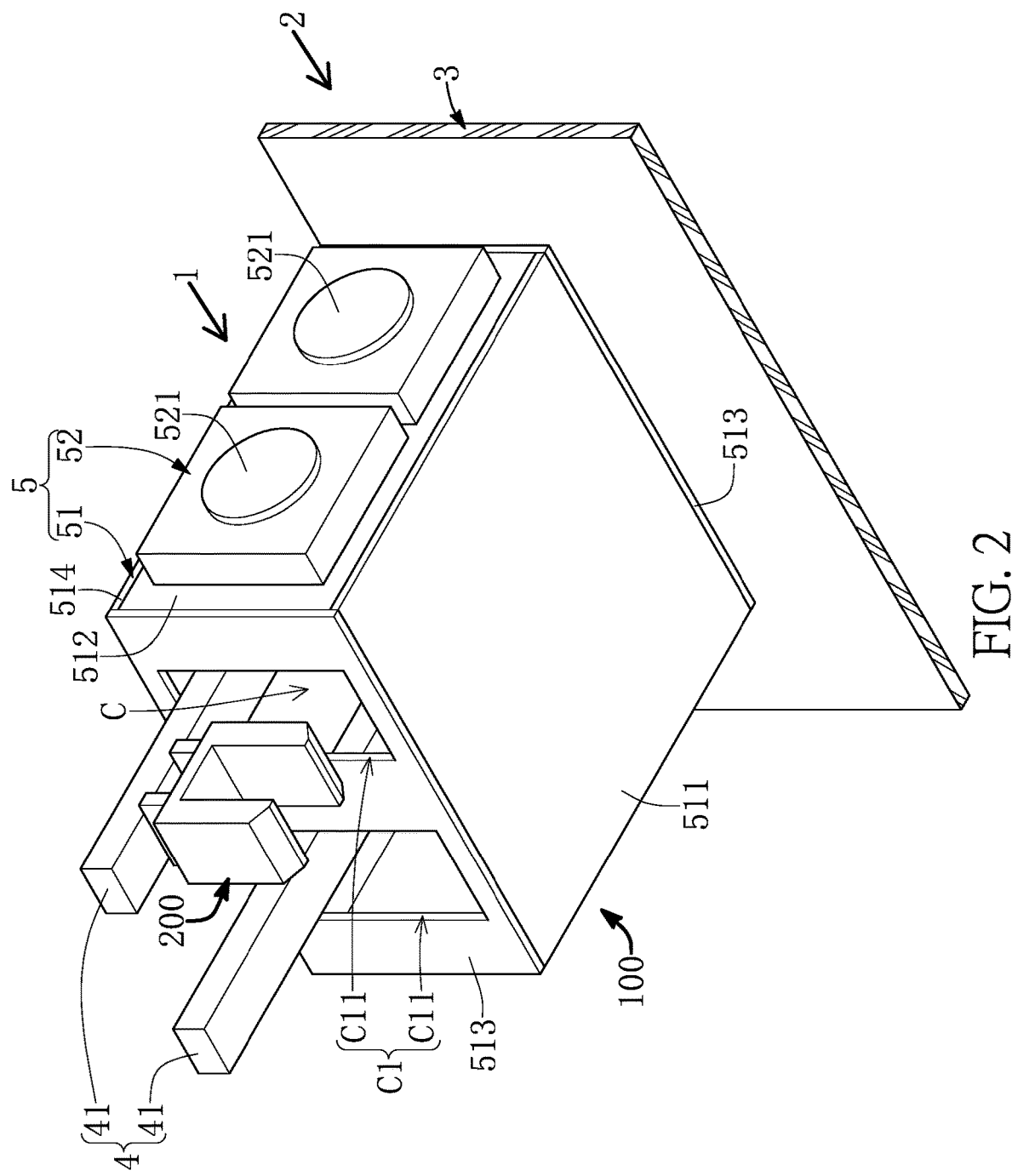
FIG. 2 is a schematic perspective view of FIG. 1 from another angle of view.
Figure 3:
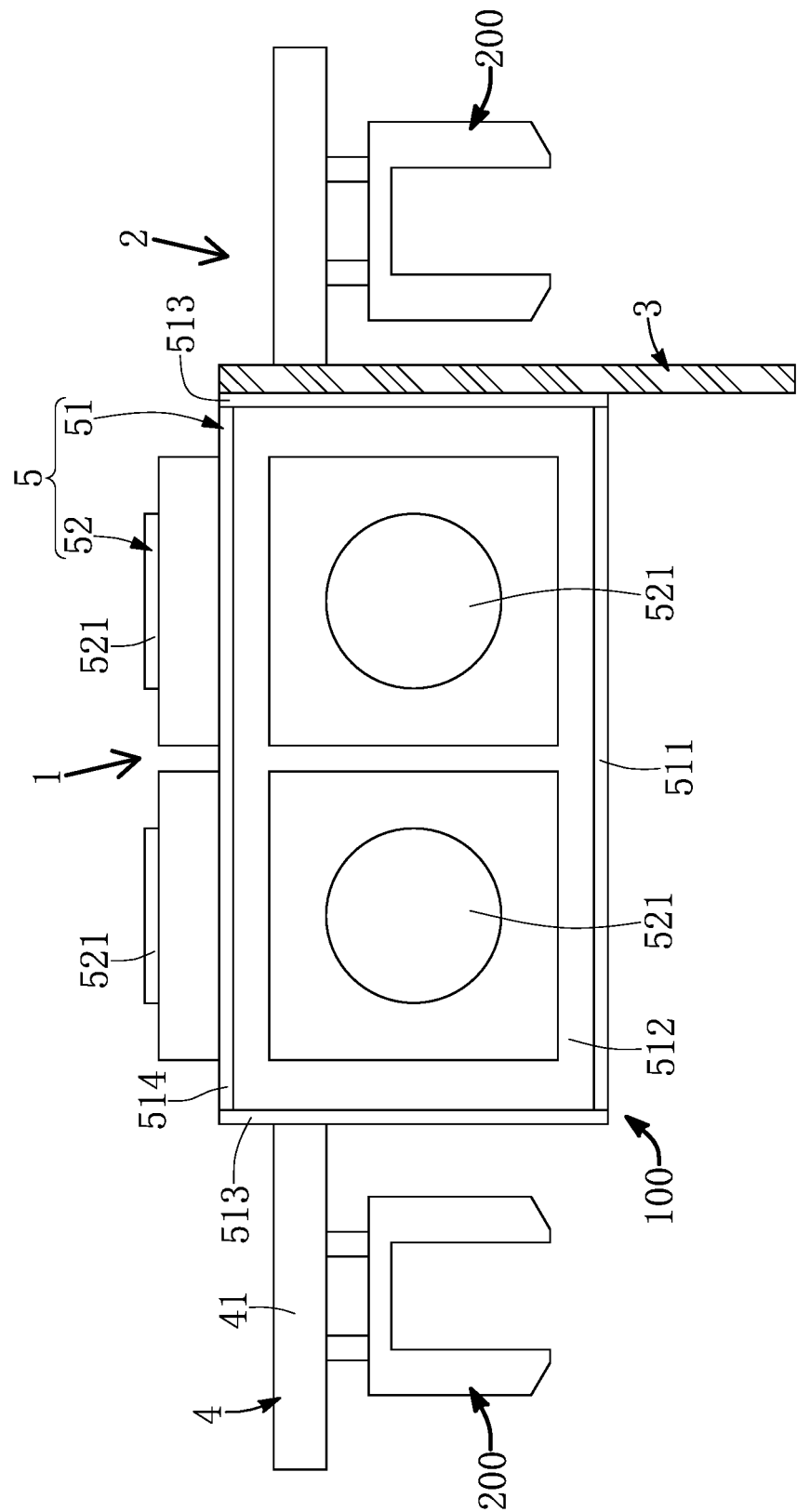
FIG. 3 is a schematic side view of FIG. 1.
Figure 4:
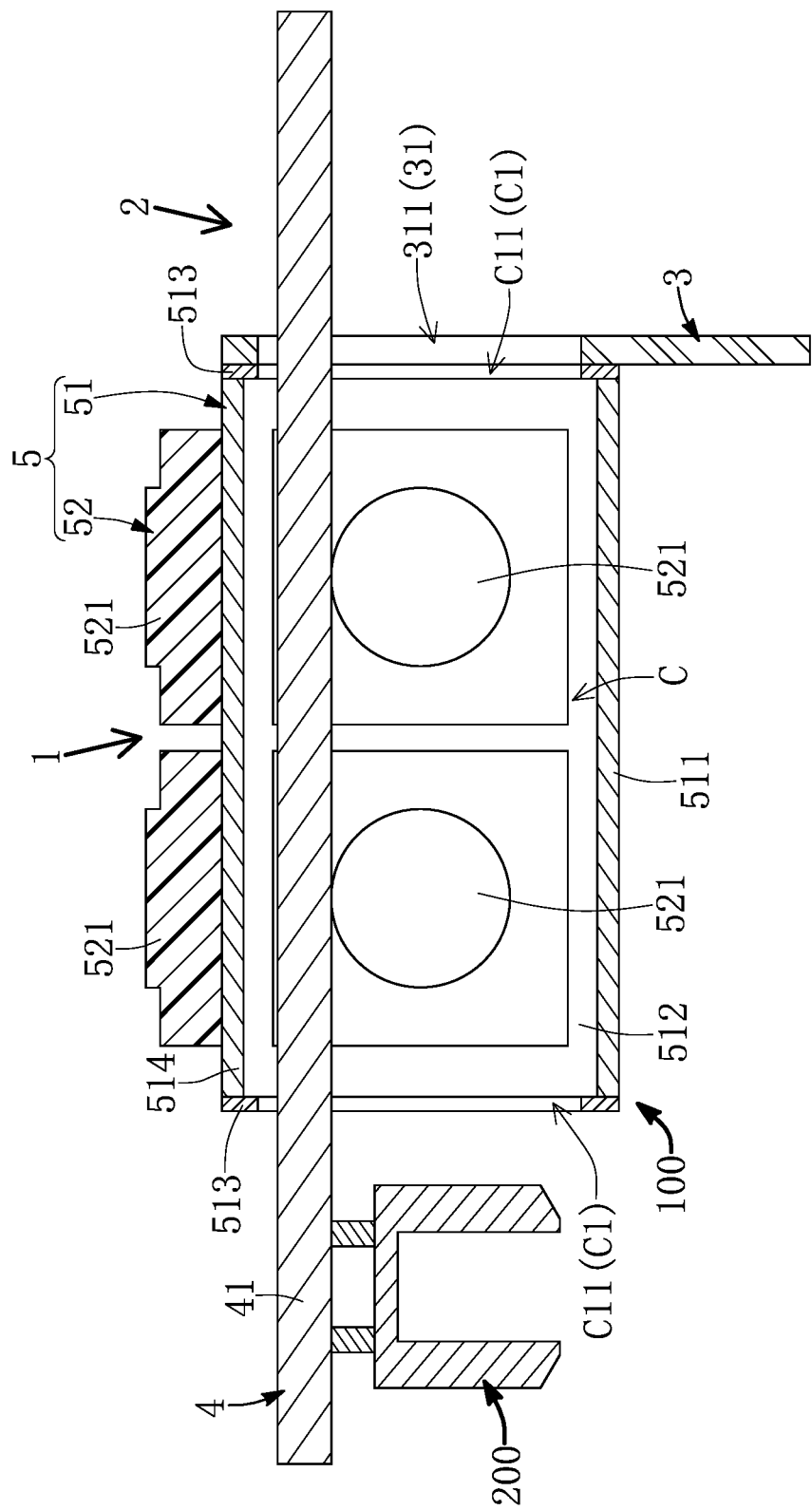
FIG. 4 is a schematic cross-sectional view of FIG. 1.
Figure 5:
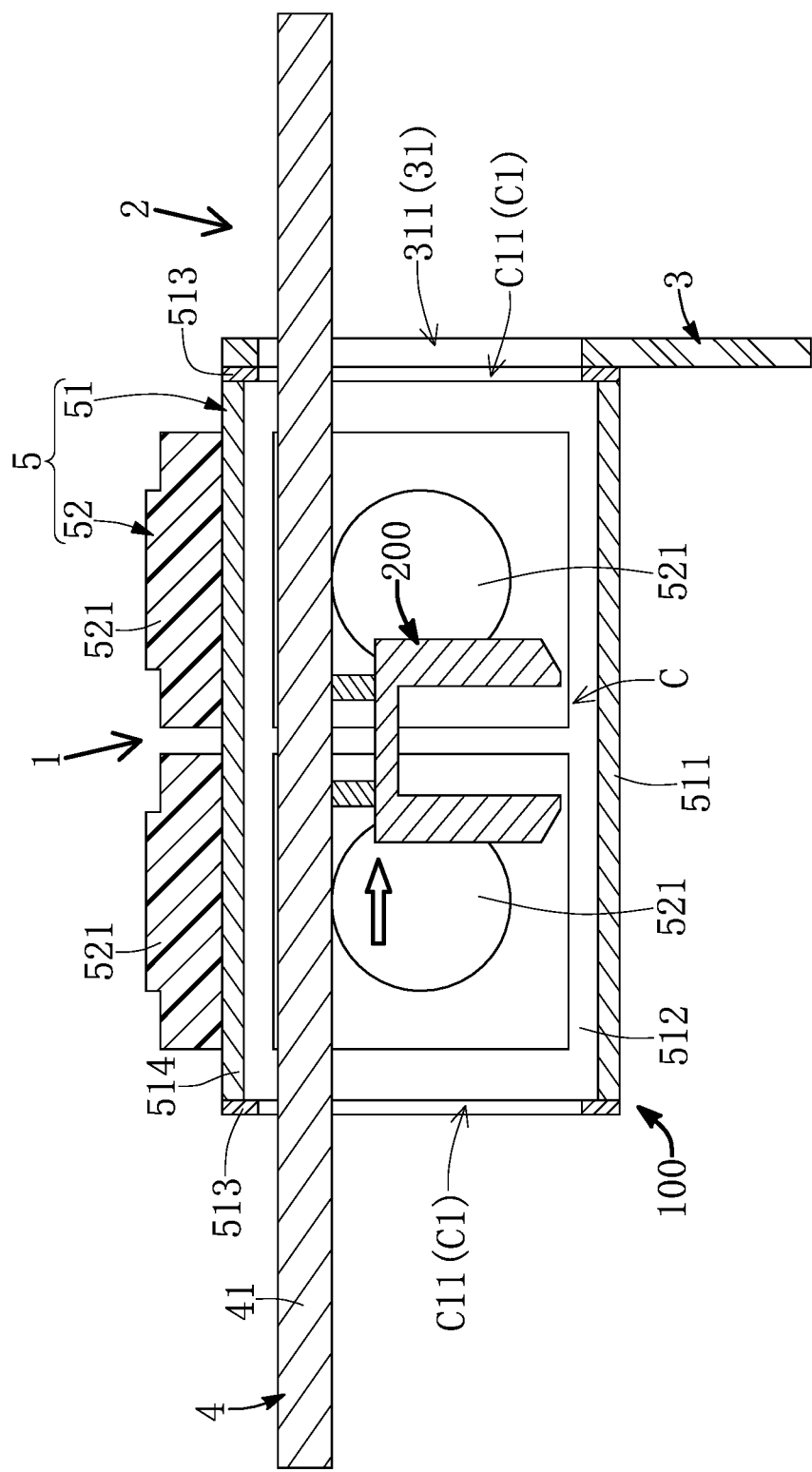
FIG. 5 is a schematic cross-sectional view showing a transfer vehicle of FIG. 4 moved from a first room into a transition device.
Figure 6:
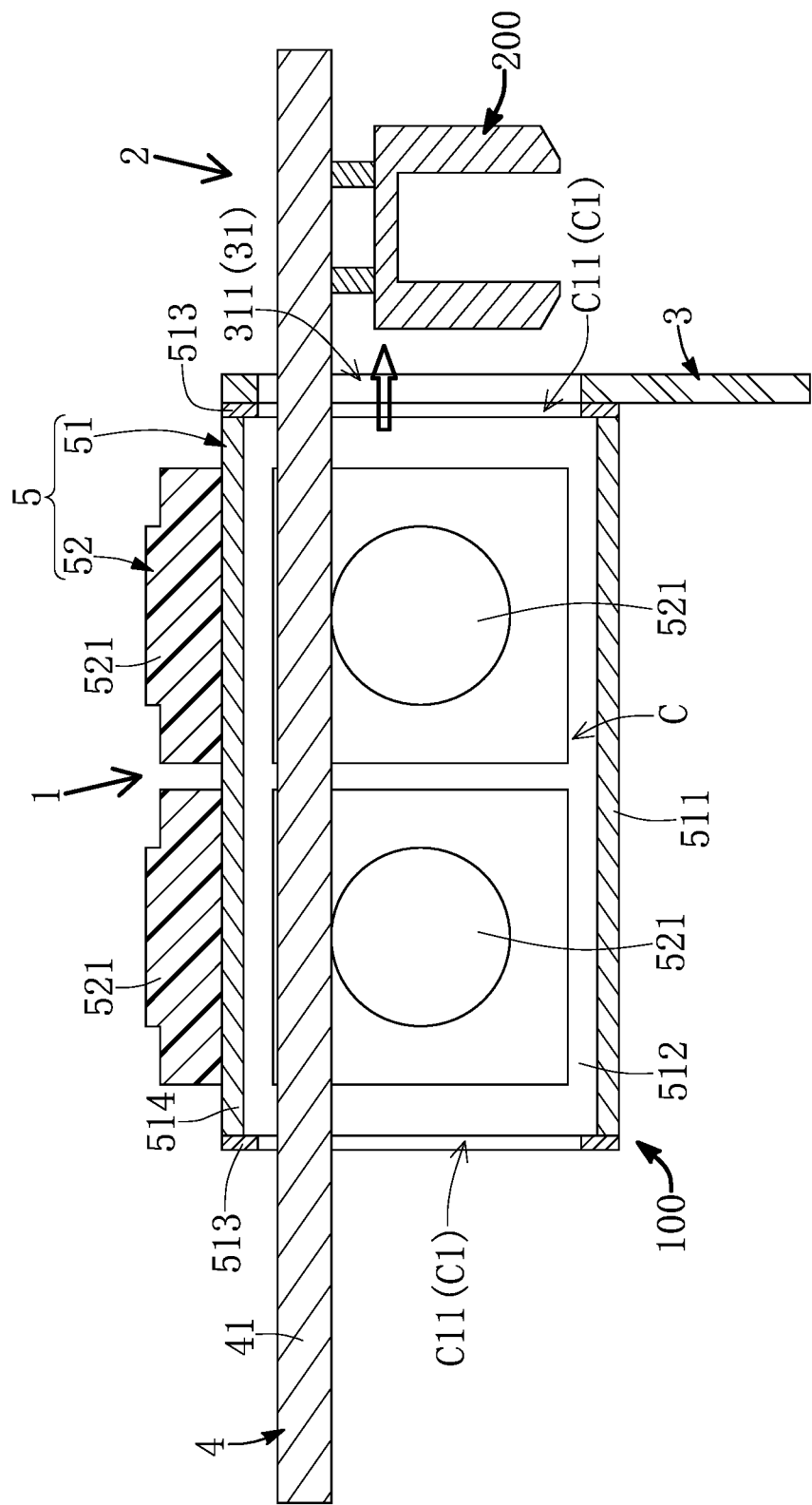
FIG. 6 is a schematic cross-sectional view showing the transfer vehicle of FIG. 5 moved from the transition device into a second room.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure is provided. The present embodiment discloses a factory transition system 100 preferably applied to cleanrooms of a semiconductor plant, but the present disclosure is not limited thereto. The factory transition system 100 includes a first room 1, a second room 2 arranged adjacent to the first room 1, a partition wall 3 arranged to separate the first room 1 and the second room 2 from each other, a track module 4 penetrating through the partition wall 3, and a transition device 5 that is disposed on the partition wall 3.

It should be noted that the transition device 5 of the factory transition system 100 in the present embodiment is described in cooperation with the first room 1, the second room 2, the partition wall 3, and the track module 4, but the present disclosure is not limited thereto. For example, in other embodiments of the present disclosure not shown in the drawings, the transition device 5 can be independently used based on the design requirement (e.g., sold) or can be used in cooperation with other components.

In the present embodiment, the first room 1 has a first cleanliness requirement being lower than a second cleanliness requirement of the second room 2, and an air pressure of the first room 1 is lower than an air pressure of the second room 2. For example, the first cleanliness requirement of the first room 1 can be Class 100K, the second cleanliness requirement of the second room 2 can be Class 1K, and a difference between the air pressure of the first room 1 and the air pressure of the second room 2 can be within a range from 2 Pa to 5 Pa, but the present disclosure is not limited thereto.

Moreover, the partition wall 3 has a communication opening 31 for enabling the first room 1 and the second room 2 to be in spatial communication with each other. The communication opening 31 is arranged on a top portion of the partition wall 3. The track module 4 is arranged in the first room 1 and the second room 2 by passing through the transition device 5 and the communication opening 31, so that the track module 4 is configured to allow at least one transfer vehicle 200 (e.g., an overhead hoist transfer) to move thereon.

In the present embodiment, the communication opening 31 has two sub-openings 311, the track module 4 can be a transfer system of overhead hoist transfer (OHT) having two tracks 41 respectively passing through the two sub-openings 311, and each of the two tracks 41 allows one transfer vehicle 200 to move thereon, but the present disclosure is not limited thereto. For example, in other embodiments of the present disclosure not shown in the drawings, a quantity of the sub-openings 311 of the communication opening 31 can be adjusted or changed according to design requirements (e.g., one or more than one), and the track module 4 has at least one track 41 passing through the communication opening 31.

The transition device 5 is arranged in the first room 1 and corresponds in position to the communication opening 31. The transition device 5 includes a chamber 51 and a filtering module 52 that is assembled to the chamber 51. Specifically, the chamber 51 has a transition channel C formed therein, and the transition channel C has two entrances C1 respectively arranged on two ends thereof.

One of the two entrances C1 of the chamber 51 corresponds in position and shape to the communication opening 31 (e.g., the communication opening 31 and the one of the two entrances C1 are flush with each other and are spatially communicated with each other), and the track module 4 passes through the transition channel C through the two entrances C1. In other words, the entrance C1 corresponding to the communication opening 31 in the present embodiment has two sub-entrances C11 respectively corresponding in position to the two sub-openings 311, but the present disclosure is not limited thereto.

Specifically, the chamber 51 in the present embodiment substantially has a cuboid shape, and the chamber 51 includes a bottom plate 511, two side plates 512 and two end plates 513 respectively connected to peripheral edges of the bottom plate 511, and a top plate 514 that is connected to the two side plates 512 and the two end plates 513. The bottom plate 511 is provided without any hole, the two entrances C1 are respectively formed on the two end plates 513, and one of the two end plates 513 is abutted against (or is fixed onto) the partition wall 3, so that the entrance C1 formed in the one of the two end plates 513 can be flush with the communication opening 31, but the present disclosure is not limited thereto. For example, in other embodiments of the present disclosure not shown in the drawings, one of the two entrances C1 of the chamber 51 can be formed by omitting (or removing) at least one of the two end plates 513.

The filtering module 52 is spatially communicated with the transition channel C. The filtering module 52 is configured to perform a ventilation and filtration process for continuously suctioning air from the first room 1 into the transition channel C after filtering the air. In other words, the first room 1 and the second room 2 can be in spatial communication with each other through the transition channel C.

In the present embodiment, the filtering module 52 includes a plurality of fan filter units (FFUs) 521, and the fan filter units 521 are configured to simultaneously suction the air from the first room 1 into the transition channel C after filtering the air. Moreover, the filtering module 52 (e.g., the fan filter units 521) can be assembled to at least one of the top plate 514 and the two side plates 512, and the filtering module 52 is preferably assembled to an external side of the chamber 51, but the present disclosure is not limited thereto.

Accordingly, the factory transition system 100 disclosed in the present embodiment is provided with the transition device 5 in the first room 1, so that the automatic door adopted by the conventional transition device can be effectively replaced by using the filtering module to perform the ventilation and filtration process, thereby preventing air from traveling from the first room 1 to the second room 2 by flowing through the transition channel C. Accordingly, the track module 4 and the at least one transfer vehicle 200 can have a better efficiency for transporting objects between the first room 1 and the second room 2, thereby increasing the manufacturing capacity of factory.

Specifically, the transition channel C and the second room 2 have an air pressure difference therebetween at the communication opening 31, and the filtering module 52 is configured to continuously perform the ventilation and filtration process for maintaining the air pressure difference to be less than or equal to 0.5 Pa. In other words, when there is no transfer vehicle 200 to move through the transition channel C, a flow field in the transition channel C is at a steady state, and the filtering module 52 can continuously perform the ventilation and filtration process to provide a sufficient pressure in the transition channel C, thereby enabling the communication opening 31 to almost have no airflow.

Moreover, when the at least one transfer vehicle 200 is moving along the track module 4 from the first room 1 to the second room 2 by traveling through the transition channel C, the flow field in the transition channel C is disturbed from the steady state to a turbulent state, and the filtering module 52 is configured to perform the ventilation and filtration process to the flow field at the turbulent state for restoring the flow field to the steady state within a predetermined time period. The predetermined time period can be within a range from 3 seconds to 25 seconds and can be adjusted or changed according to design requirements, but the present disclosure is not limited thereto.

Second Embodiment

Figure 7:
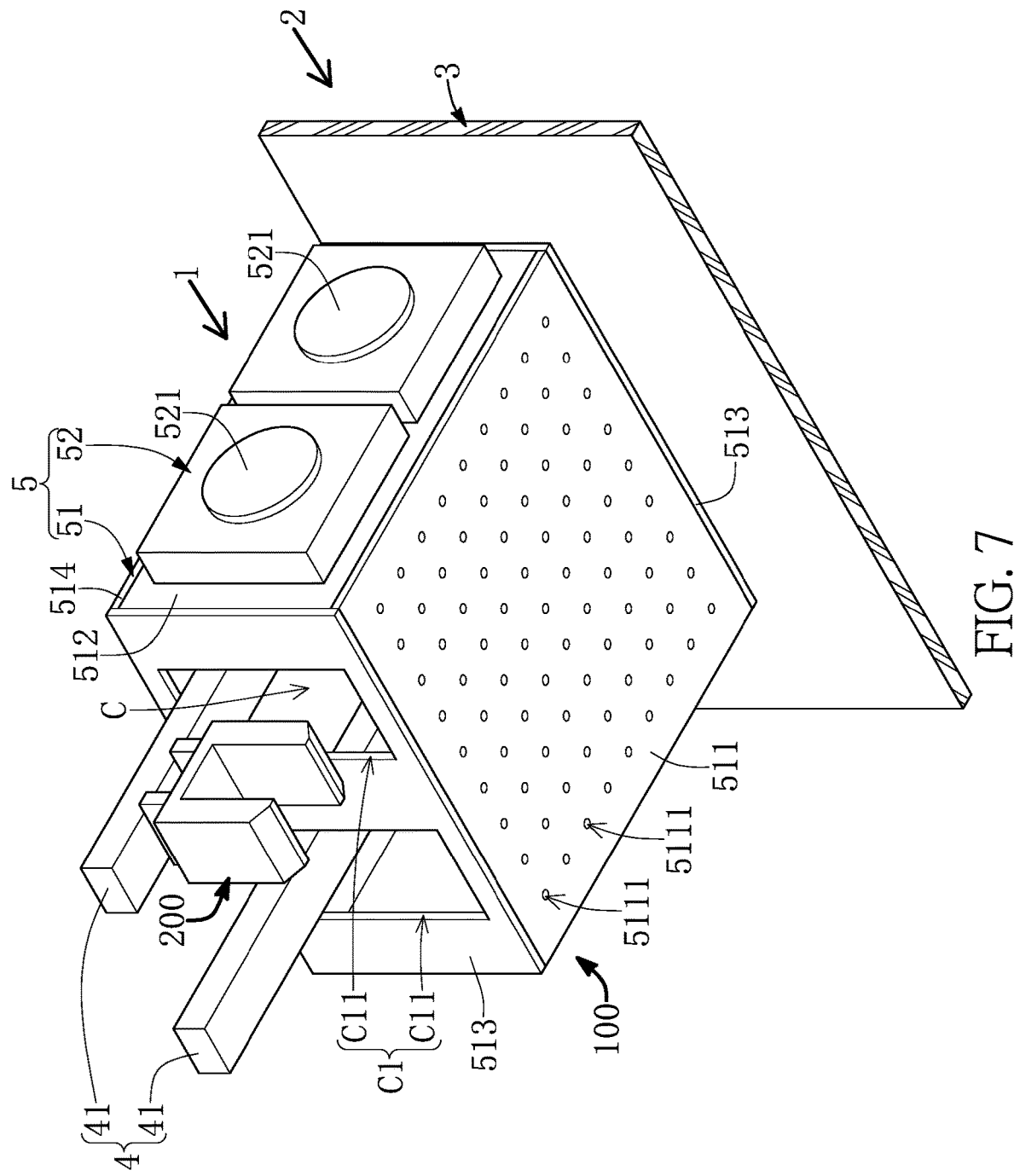
FIG. 7 is a schematic perspective view of the factory transition system according to a second embodiment of the present disclosure.
Figure 8:
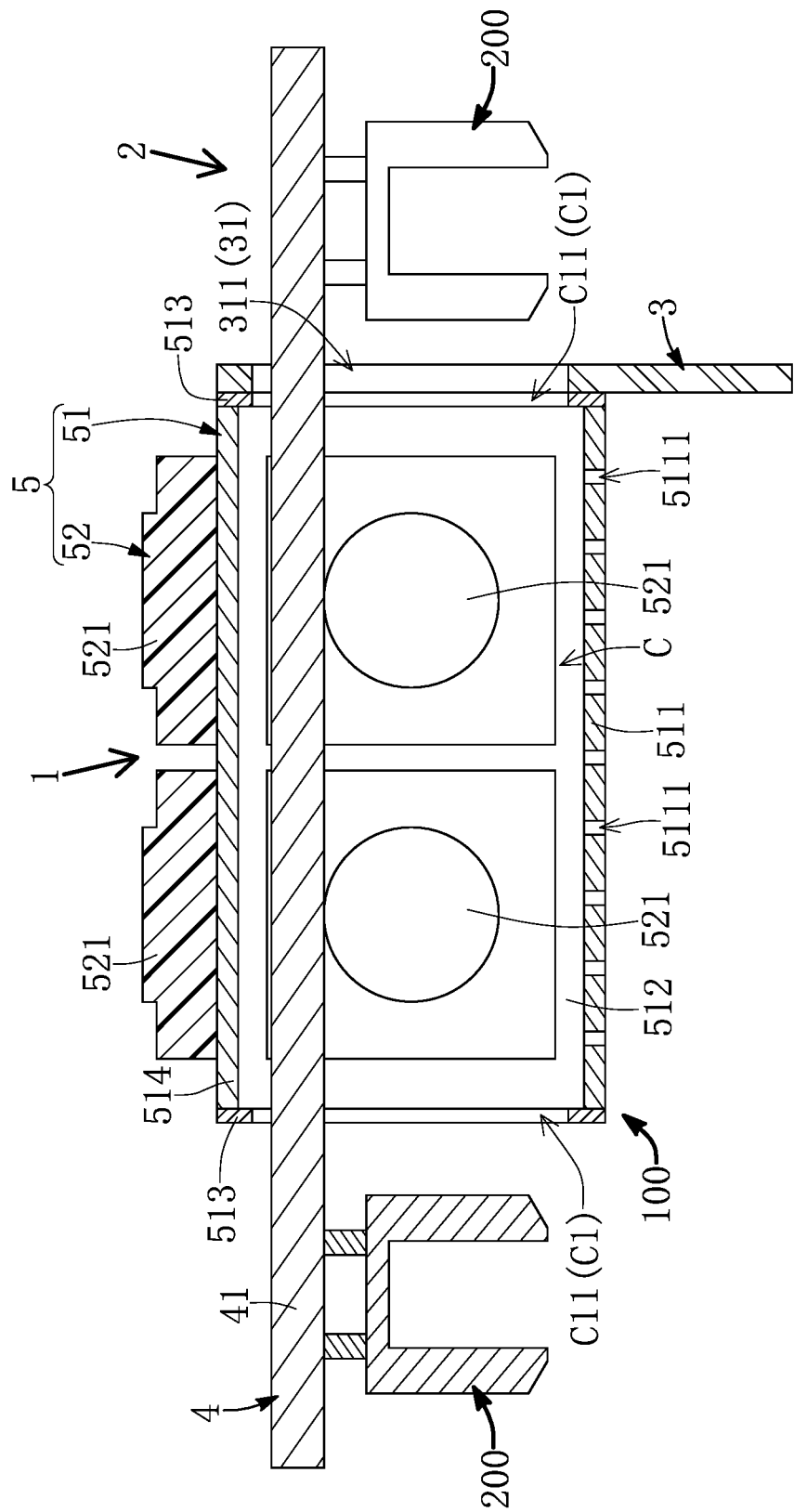
FIG. 8 is a schematic cross-sectional view of FIG. 7.

Referring to FIG. 7 and FIG. 8, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the bottom plate 511 has a plurality of holes 5111 such that the transition channel C is spatially communicated with an external environment (e.g., the first room 1) through the holes 5111. The holes 5111 of the bottom plate 511 have an open ratio being less than or equal to 25%. The open ratio is preferably within a range from 10% to 20%. Specifically, when the bottom plate 511 in the present embodiment having the open ratio of 15% is compared to the bottom plate 511 of the first embodiment provided without any hole, the predetermined time period of the factory transition system 100 in the present embodiment can be controlled to be lower than that of the first embodiment, thereby effectively further increasing the manufacturing capacity of factory.

Third Embodiment

Figure 9:
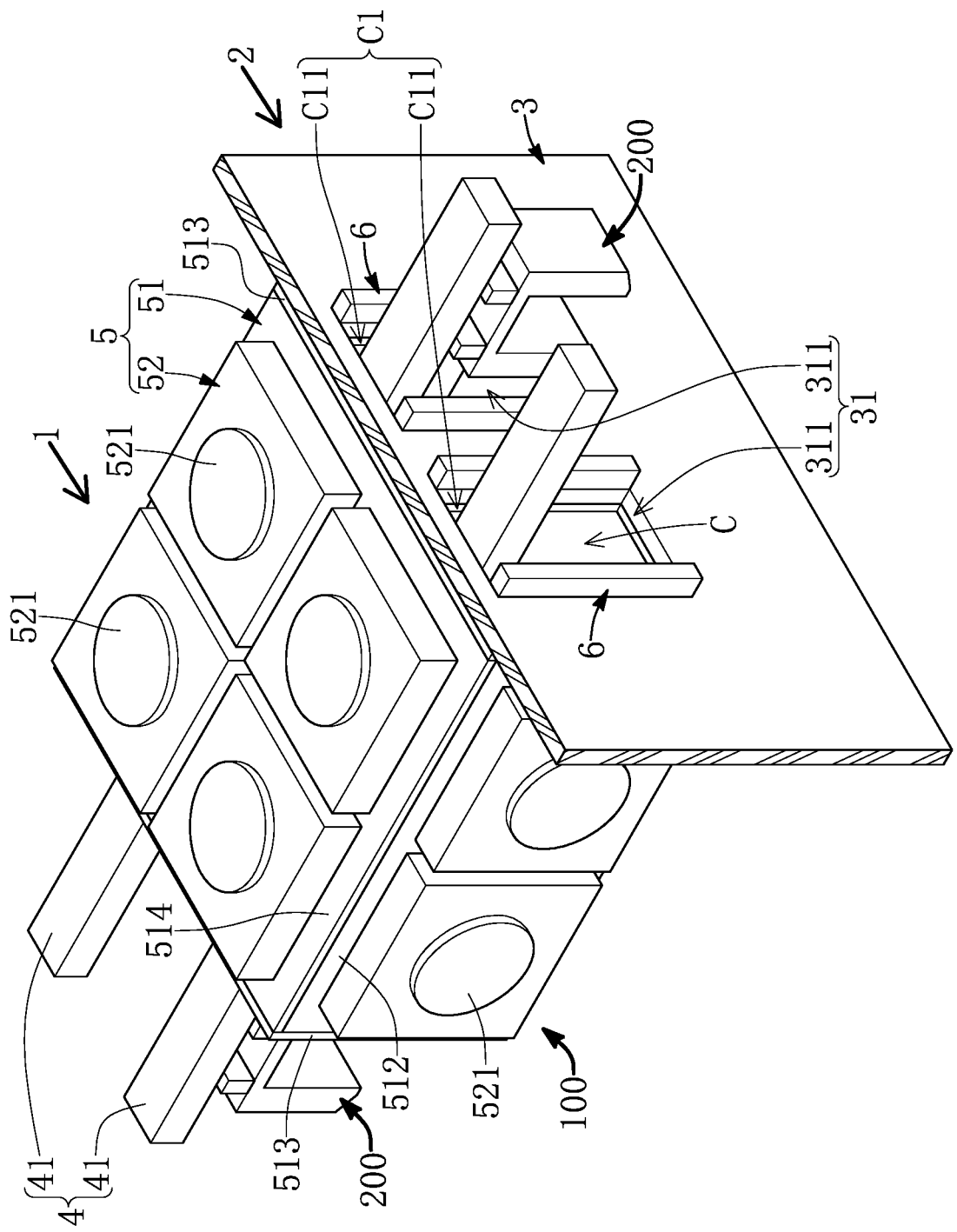
FIG. 9 is a schematic perspective view of the factory transition system according to a third embodiment of the present disclosure.
Figure 10:
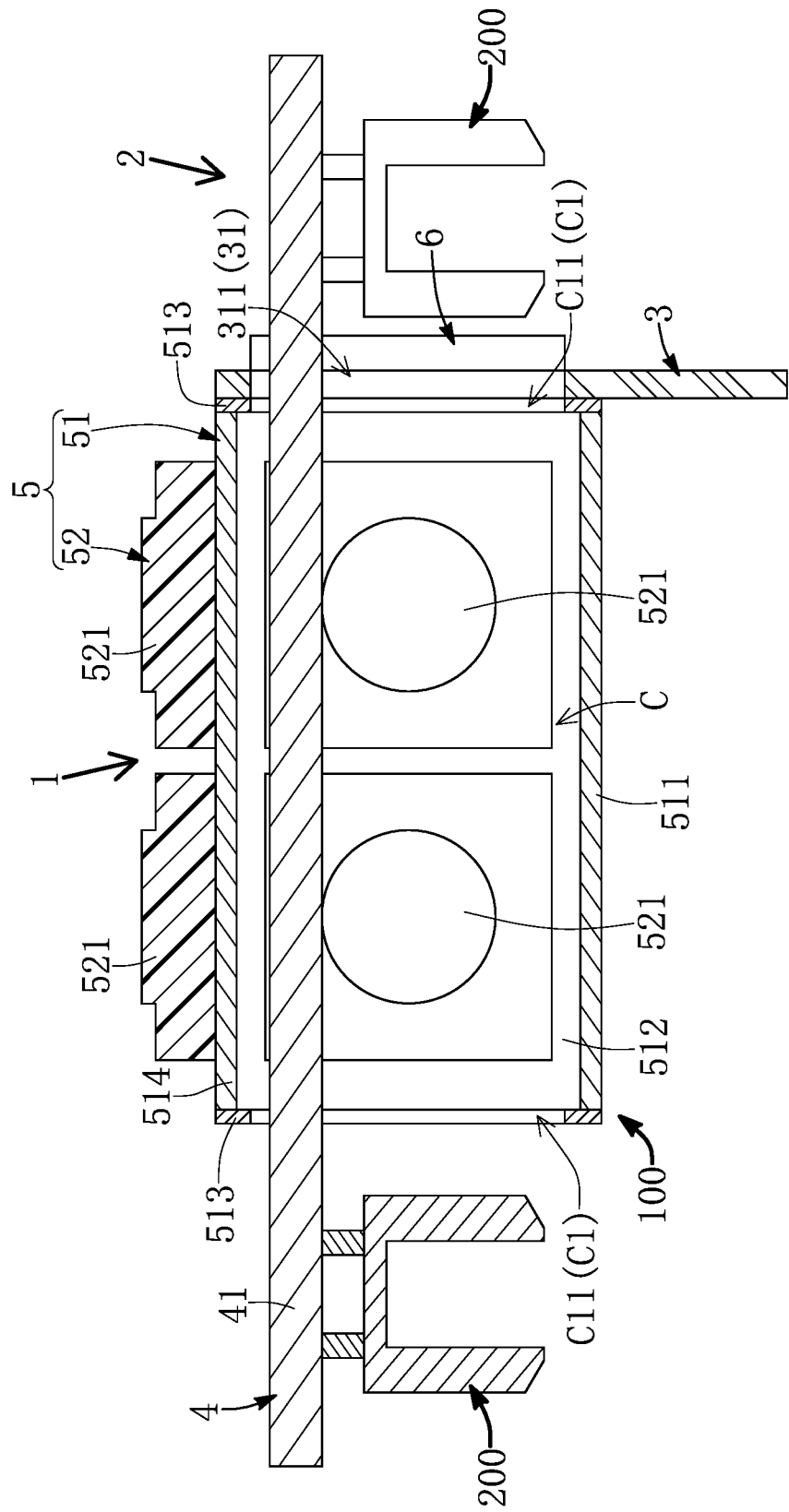
FIG. 10 is a schematic cross-sectional view of FIG. 9.
Figure 11:
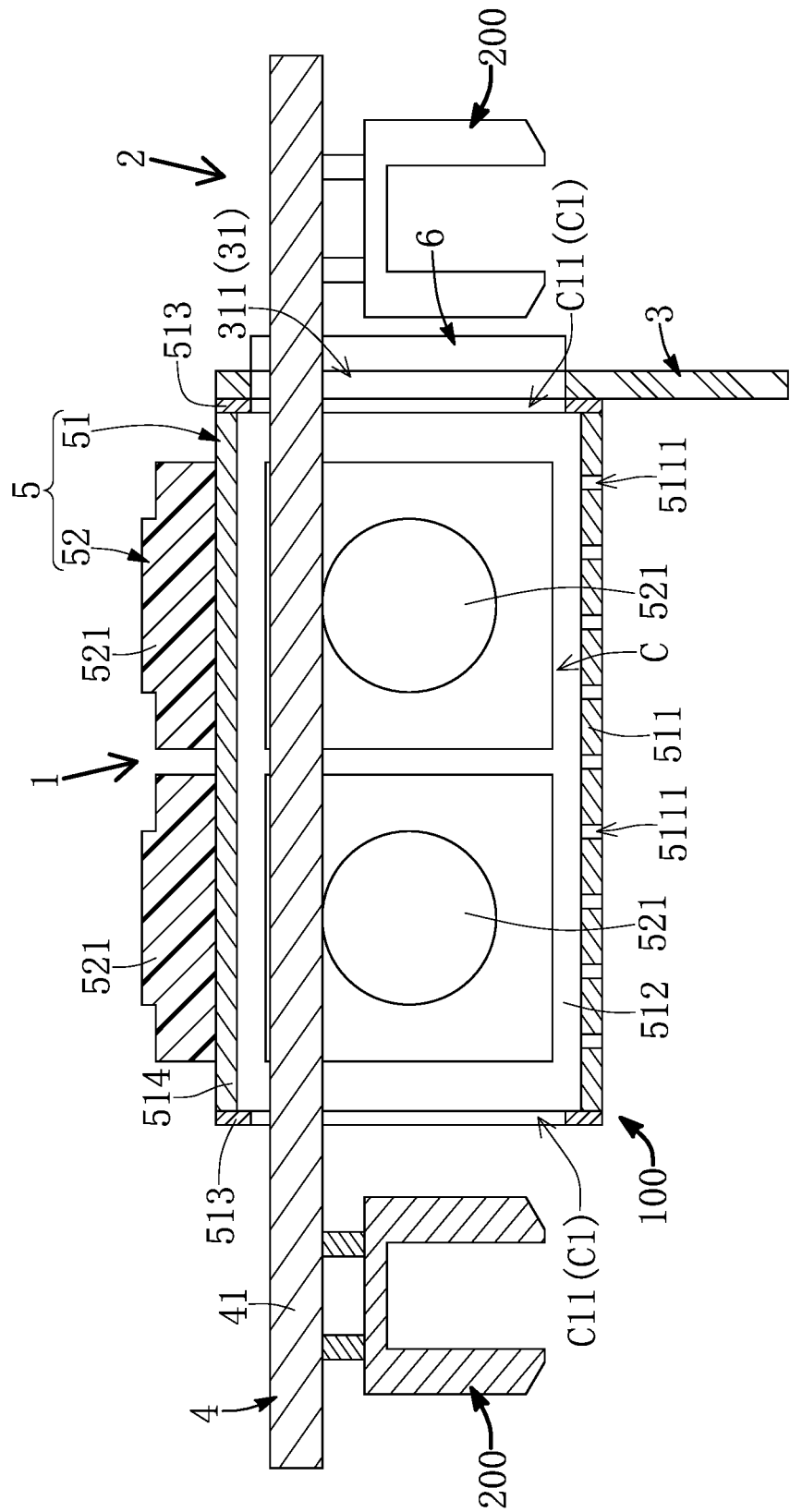
FIG. 11 is a schematic cross-sectional view of FIG. 9 in another configuration.

Referring to FIG. 9 to FIG. 11, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, the factory transition system 100 further includes at least one air curtain 6 assembled to the partition wall 3. The at least one air curtain 6 is arranged in the second room 2 and corresponds in position to the communication opening 31. In other words, the transition device 5 and the at least one air curtain 6 are respectively assembled to two opposite sides of the partition wall 3.

The at least one air curtain 6 can be operated to continuously output air for enclosing the communication opening 31, thereby effectively avoiding air to travel from the first room 1 to the second room 2 by flowing through the transition channel C. Moreover, a cubic meter per minute (CMM) of the at least one air curtain 6 can be within a range from 20 $m^3$/min to 50 $m^3$/min, but the present disclosure is not limited thereto.

Beneficial Effects of the Embodiments

In conclusion, the factory transition system in the present disclosure is provided with the transition device in the first room, so that the automatic door adopted by the conventional transition device can be effectively replaced by using the filtering module to perform the ventilation and filtration process, thereby preventing air from traveling from the first room to the second room by flowing through the transition channel. Accordingly, the track module and the at least one transfer vehicle can have a better efficiency for transporting objects between the first room and the second room, thereby increasing the manufacturing capacity of factory.

Moreover, in any one of the factory transition system and the transition device provided by the present disclosure, the holes of the bottom plate of the chamber can have the open ratio of a specific value (e.g., the open ratio being less than or equal to 25%), thereby shortening the predetermined time period for restoring the flow field from the turbulent state to the steady state.

In addition, in any one of the factory transition system and the transition device provided by the present disclosure, the partition wall can be assembled with the air curtain according to design requirements, and the air curtain can be operated to continuously output air for enclosing the communication opening, thereby effectively avoiding air to travel from the first room to the second room by flowing through the transition channel.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A factory transition system, comprising:
a first room and a second room, wherein the first room and the second room are arranged adjacent to each other, and a first cleanliness requirement of the first room is lower than a second cleanliness requirement of the second room;
a partition wall arranged to separate the first room and the second room from each other, wherein the partition wall has a communication opening for enabling the first room and the second room to be in spatial communication with each other;
a track module arranged in the first room and the second room by passing through the communication opening, wherein the track module is configured to allow at least one transfer vehicle to move thereon; and
a transition device arranged in the first room and corresponding in position to the communication opening, wherein the transition device includes:
a chamber having a transition channel formed therein, wherein the transition channel has two entrances respectively arranged on two ends thereof, and wherein the chamber corresponds in position to the communication opening through one of the two entrances, and the track module passes through the transition channel; and
a filtering module assembled to the chamber and spatially communicated with the transition channel, wherein the filtering module is configured to perform a ventilation and filtration process for continuously suctioning air from the first room into the transition channel after filtering the air.

2. The factory transition system according to claim 1, wherein the filtering module includes a plurality of fan filter units (FFUs), and the fan filter units are configured to simultaneously suction the air from the first room into the transition channel after filtering the air.

3. The factory transition system according to claim 1, wherein the transition channel and the second room have an air pressure difference therebetween at the communication opening, and the filtering module is configured to continuously perform the ventilation and filtration process for maintaining the air pressure difference to be less than or equal to 0.5 Pa.

4. The factory transition system according to claim 1, wherein the chamber includes a bottom plate, two side plates connected to the bottom plate, and a top plate that is connected to the two side plates, wherein the bottom plate has a plurality of holes such that the transition channel is spatially communicated with the first room through the holes, and wherein the filtering module is assembled to at least one of the top plate and the two side plates.

5. The factory transition system according to claim 4, wherein the holes of the bottom plate have an open ratio being less than or equal to 25%.

6. The factory transition system according to claim 1, further comprising at least one air curtain assembled to the partition wall, wherein the at least one air curtain corresponds in position to the communication opening.

7. The factory transition system according to claim 1, wherein, when the at least one transfer vehicle is moving along the track module from the first room to the second room by traveling through the transition channel, a flow field in the transition channel is disturbed from a steady state to a turbulent state, and the filtering module is configured to perform the ventilation and filtration process to the flow field at the turbulent state for restoring the flow field to the steady state within a predetermined time period.

8. A transition device of a factory transition system for being disposed on a partition wall that separates two rooms from each other, the transition device comprising:
a chamber having a transition channel formed therein, wherein the transition channel has two entrances respectively arranged on two ends thereof, and wherein the chamber is configured to correspond in position to a communication opening of the partition through one of the two entrances;
a track module that passes through the transition channel for being arranged in the two rooms and that is configured to allow at least one transfer vehicle to move thereon; and
a filtering module assembled to the chamber and spatially communicated with the transition channel, wherein the filtering module is configured to perform a ventilation and filtration process for continuously suctioning air from an external environment of the transition device into the transition channel after filtering the air.

9. The transition device according to claim 8, wherein the chamber includes a bottom plate, two side plates connected to the bottom plate, and a top plate that is connected to the two side plates, wherein the bottom plate has a plurality of holes such that the transition channel is spatially communicated with the external environment through the holes, and wherein the filtering module is assembled to at least one of the top plate and the two side plates.

10. The transition device according to claim 9, wherein the holes of the bottom plate have an open ratio being less than or equal to 25%.

* * * * *